United States Patent
Ishisaka

(10) Patent No.: US 9,142,435 B2
(45) Date of Patent: Sep. 22, 2015

(54) SUBSTRATE STAGE OF SUBSTRATE PROCESSING APPARATUS AND SUBSTRATE PROCESSING APPARATUS

(75) Inventor: Mitsunori Ishisaka, Namerikawa (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1192 days.

(21) Appl. No.: 12/410,261

(22) Filed: Mar. 24, 2009

(65) Prior Publication Data

US 2009/0241836 A1  Oct. 1, 2009

(30) Foreign Application Priority Data

Mar. 26, 2008 (JP) ................. 2008-080114
Dec. 8, 2008 (JP) ................. 2008-312266

(51) Int. Cl.
*C23C 16/46* (2006.01)
*H01L 21/67* (2006.01)

(52) U.S. Cl.
CPC .... *H01L 21/67109* (2013.01); *H01L 21/67103* (2013.01)

(58) Field of Classification Search
USPC .............. 118/723 R, 725, 724; 156/345.52
See application file for complete search history.

(56) References Cited

U.S. PATENT DOCUMENTS

| | | | | |
|---|---|---|---|---|
| 5,280,156 A * | 1/1994 | Niori et al. | ...................... | 219/385 |
| 5,294,778 A * | 3/1994 | Carman et al. | ................. | 219/385 |
| 6,321,680 B2 * | 11/2001 | Cook et al. | ................ | 118/723 E |
| 6,483,989 B1 * | 11/2002 | Okada et al. | ................... | 392/418 |
| 6,753,272 B1 * | 6/2004 | Lee et al. | ....................... | 438/795 |
| 6,951,587 B1 * | 10/2005 | Narushima | .................... | 118/728 |
| 7,274,004 B2 * | 9/2007 | Benjamin et al. | .......... | 219/444.1 |
| 7,972,444 B2 * | 7/2011 | Zucker et al. | ................. | 118/728 |
| 2004/0115947 A1 * | 6/2004 | Fink et al. | ..................... | 438/716 |
| 2005/0022742 A1 * | 2/2005 | Hong et al. | ................... | 118/725 |
| 2008/0066682 A1 * | 3/2008 | Yamashita | .............. | 118/723 VE |
| 2008/0092818 A1 * | 4/2008 | Fink et al. | ..................... | 118/724 |
| 2009/0241836 A1 * | 10/2009 | Ishisaka | .................... | 118/723 R |
| 2011/0005686 A1 * | 1/2011 | Tanaka et al. | ............ | 156/345.52 |

FOREIGN PATENT DOCUMENTS

JP   06077148   3/1994
JP   2005018992  1/2005

OTHER PUBLICATIONS

Machine Generated English Translation of JP 2005-018992 published Jan. 20, 2005.*
Machine Generated English Translation of JP 06-077148 published Mar. 18, 1994.*

* cited by examiner

*Primary Examiner* — Sylvia R Macarthur
(74) *Attorney, Agent, or Firm* — Brundidge & Stanger, P.C.

(57) ABSTRACT

Provided is a substrate processing apparatus including a partitioned susceptor and configured to heat a substrate uniformly for improving process quality and yield. The substrate stage comprises a plurality of susceptor segments embedded with heating units, a substrate stage unit comprising the plurality of susceptor segments arranged in a flat configuration to define a substrate placement surface, and a uniform heating part mounted at the substrate placement surface.

17 Claims, 5 Drawing Sheets

SUBSTRATE STAGE OF SUBSTRATE PROCESSING APPARATUS AND SUBSTRATE PROCESSING APPARATUS

CROSS-REFERENCE TO RELATED PATENT APPLICATION

This U.S. non-provisional patent application claims priority under 35 U.S.C. §119 of Japanese Patent Application Nos. 2008-080114, filed on Mar. 26, 2008, and 2008-312266, filed on Dec. 8, 2008, in the Japanese Patent Office, the entire contents of which are hereby incorporated by reference.

BACKGROUND OF THE INVENTION

1. Field of the Invention

The present invention relates to a substrate processing apparatus for performing a treatment such as an oxide layer forming, thin layer forming, impurity diffusing, or etching on a substrate such as a silicon wafer.

2. Description of the Prior Art

Examples of substrate processing apparatuses include a batch type substrate processing apparatus configured to process a predetermined number of substrates at a time and a single-wafer type substrate processing apparatus configured to process substrates one by one.

In a single-wafer type substrate processing apparatus, a process chamber is provided to accommodate a substrate, a susceptor is installed in the process chamber as a substrate stage for placing the substrate thereon, the substrate is heated by a heater embedded in the susceptor, and process gas is introduced into the process chamber to treat the substrate.

Recent improvement in process yield has motivated the use of larger-diameter substrates, and accordingly, it has been required to increase the diameter of a susceptor and a heater buried in the susceptor.

However, due to restrictions such as manufacturing or maintenance restrictions, it is difficult to manufacture a large-diameter susceptor and a large-diameter heater, and it is also difficult to process a large-diameter substrate such as a 450-mm diameter substrate using a susceptor and a heater that are integrated into one piece.

SUMMARY OF THE INVENTION

An object of the present invention is to provide a substrate processing apparatus including a partitioned susceptor and configured to heat a substrate uniformly for improving process quality aid yield.

According to an aspect of the present invention, there is provided a substrate stage comprising: a plurality of susceptor segments, each of the plurality of susceptor segments being embedded with a heating unit; a substrate stage unit partitioned into the plurality of susceptor segments being exposed to a processing gas when processing a substrate wherein the plurality of susceptor segments are arranged in a manner that upper surfaces of the plurality of susceptor segments form a single plane to define a substrate placement surface; and a uniform heating part mounted at the substrate placement surface.

According to another aspect of the present invention, there is provided a substrate processing apparatus comprising: a gas supply unit configured to supply process gas; a process chamber configured to process a substrate by heating the substrate; an exhaust unit configured to exhaust an atmosphere of the process chamber; and a substrate stage installed at the process chamber for placing the substrate thereon, wherein the substrate stage comprises: a plurality of susceptor segments, each of the plurality of susceptor segments being embedded with a heating unit; a substrate stage unit partitioned into the plurality of susceptor segments being exposed to a processing gas when processing a substrate wherein the plurality of susceptor segments are arranged in a manner that upper surfaces of the plurality of susceptor segments form a single plane to define a substrate placement surface; and a uniform heating part mounted at the substrate placement surface.

DETAILED DESCRIPTION OF THE PREFERRED EMBODIMENTS

Preferable embodiments of the present invention will be described hereinafter with reference to the attached drawings.

As an example of a substrate processing apparatus of the present invention, a plasma processing apparatus is provided, which includes a plasma process furnace and is configured to process a substrate such as a wafer by using a modified magnetron typed (MMT) plasma source capable of generating high-density plasma using electric and magnetic fields. Hereinafter, the plasma processing apparatus will be referred as an MMT apparatus.

In an MMT apparatus, a substrate is loaded in an air-tightly sealed process chamber; reaction as is introduced into the process chamber through a shower head; and while maintaining the process chamber at a predetermined pressure, high-frequency power is supplied to a discharge electrode so as to generate electric and magnetic fields for magnetron discharging. Electrons emitted from the discharge electrode revolve while continuing cycloidal drifting so that the electrodes exist for a long time. Therefore, the rate of ionization can be increased, and thus high-density plasma can be generated. In this way, reaction gas can be activated or decomposed to perform various plasma processes on a substrate, such as a diffusion process (e.g., diffusion oxidization and diffusion nitrogenizing), a thin film forming process, and an etching process.

Figure 1:
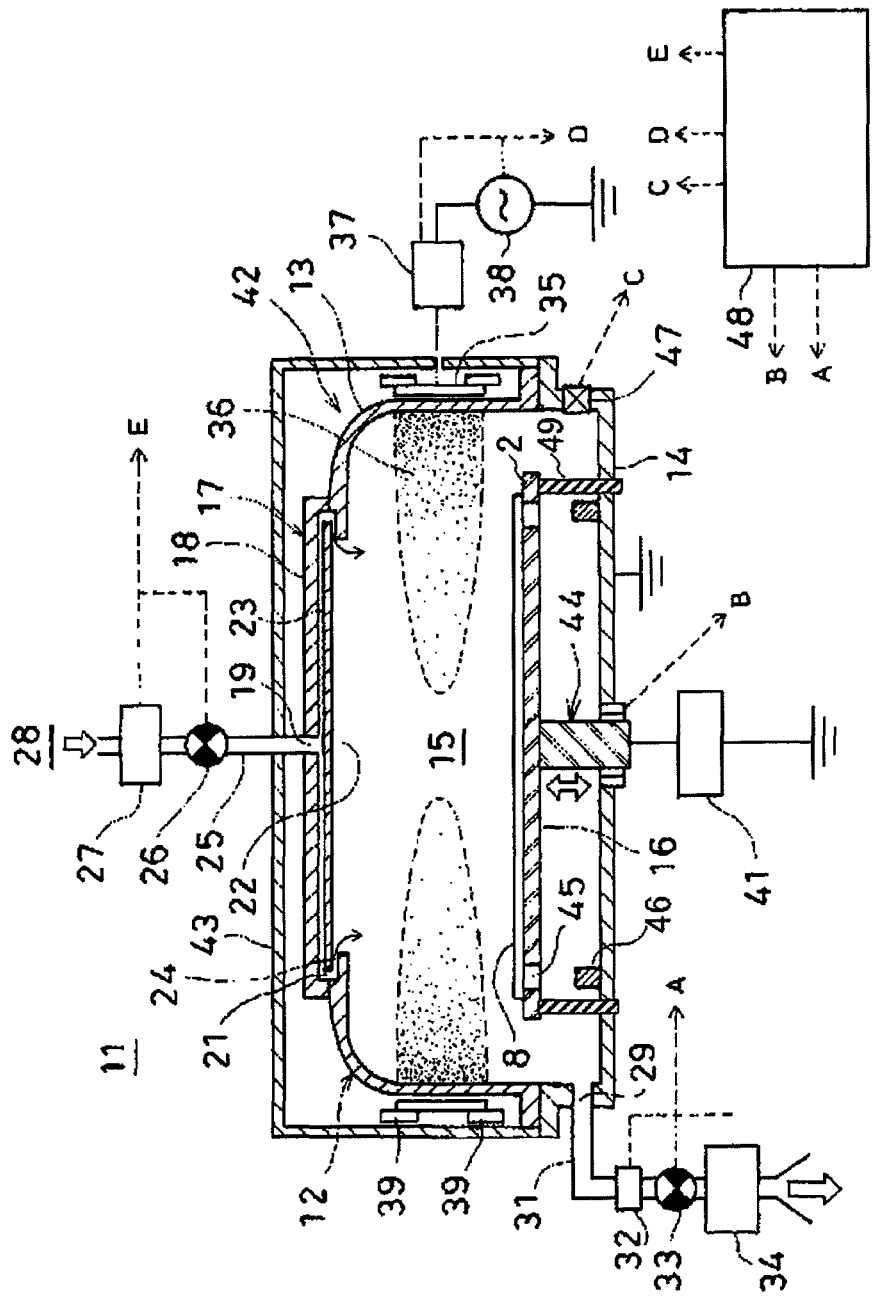
FIG. 1 is a schematic sectional view illustrating an example of a substrate processing apparatus for implementing the present invention.

An overview of an MMT apparatus will now be given with reference to FIG. 1.

An MMT apparatus 11 includes a process vessel 12, and the process vessel 12 includes a dome-shaped upper vessel 13 as a first vessel and a bowl-shaped lower vessel 14 as a second vessel. The upper vessel 13 covers the upper side of the lower vessel 14. A process chamber 15 is defined by the upper vessel 13 and the lower vessel 14.

The upper vessel 13 is made of an aluminum oxide or a nonmetallic material such as quartz, and the lower vessel 14 is made of quartz. In addition, a susceptor 16 used as a substrate stage is accommodated in the process chamber 15. The susceptor 16 includes a built-in heater (described later)

and is made of an aluminum nitride, or a nonmetallic material such as a ceramic material or quartz. The susceptor 16 reduces contaminants entering into a film during a process.

A shower head 17 is installed at an upper side of the process chamber 15. The shower head 17 includes a cap-shaped cover 18, a gas inlet 19, a buffer chamber 21, an opening 22, a shield plate 23, and a gas blow outlet 24. The buffer chamber 21 provides a space for dispersing gas introduced through the gas inlet 19.

A gas supply pipe 25 is connected to the gas inlet 19, and a gas cylinder (not shown) in which reaction gas 28 is stored is connected to the gas supply pipe 25 through an on-off valve 26 and a mass flow controller 27 used as a flow rate controller (flow rate control unit).

Reaction gas 28 is supplied to the process chamber 15 through the shower head 17, and a gas exhaust outlet 29 is installed at a sidewall of the lower vessel 14 so that the reaction gas 28 can flow from the vicinity of the susceptor 16 to the bottom side of the process chamber 15 after the reaction gas 28 is used for processing a substrate.

The gas exhaust outlet 29 is connected to a gas exhaust pipe 31 for exhausting gas, and the gas exhaust pipe 31 is connected to a vacuum pump (exhaust device) via an automatic pressure control (APC) 32 (pressure regulator) and an on-off valve 33.

As a discharging structure (discharging unit) for exciting reaction gas 28, a tubular electrode 35 (first electrode) having a tubular shape such as a cylindrical shape is installed. The tubular electrode 35 is installed around the circumference of the upper vessel 13 to surround a plasma generating region 36 defined inside the process chamber 15. A high-frequency power supply 38 is connected to the tubular electrode 35 through a matching device 37 used for impedance matching.

In addition, as magnetic field forming structures (magnetic field forming units), a pair of upper and lower tubular magnets 39 configured by permanent magnets are installed around the periphery of the tubular electrode 35. The upper and lower tubular magnets 39 have magnetic poles at both ends (inner and outer circumferential ends) along a radial direction of the process chamber 15 with opposite poles of the upper and lower tubular magnets 39 being aligned with each other. Therefore, the inner-circumferential magnetic poles of the upper and lower tubular magnets 39 have opposite polarities, and thus magnetic field lines are formed along the inner circumference of the tubular electrode 35 in the center-axis direction of the tubular electrode 35.

At the lower center side of the process chamber 15, the susceptor 16 is installed for supporting a substrate (hereinafter, referred as a wafer 8). A heater (not shown) is integrally buried in the susceptor 16 as a heating structure (heating unit) for heating the wafer 8. The heater is configured to heat the wafer 8 to a temperature of about 400° C. to about 800° C.

Inside the susceptor 16, a second electrode (not shown) is equipped to adjust impedance. The second electrode is grounded via an impedance varying device 41.

The impedance varying device 41 is configured by a coil or a variable condenser so that the potential of the wafer 8 can be controlled via the second electrode and the susceptor 16 by varying the number of patterns of the coil or the capacitance of the variable condenser.

A process furnace 42 configured to process a wafer 8 by magnetron-discharging of a magnetron type plasma source is constituted by at least the process chamber 15, the process vessel 12, the susceptor 16, the tubular electrode 35, the tubular magnets 39, the shower head 17, and the gas exhaust outlet 29. In the process chamber 15, a wafer 8 can be processed using plasma.

Around the tubular electrode 35 and the tubular magnets 39, a shield plate 43 is installed to prevent electric and magnetic fields formed by the tubular electrode 35 and the tubular magnets 39 from affecting outside environments or other apparatuses such as other furnaces.

The susceptor 16 is insulated from the lower vessel 14, and a susceptor elevating mechanism (elevating unit) 44 is installed to move the susceptor 16 upward and downward. Penetration holes 45 are formed through the susceptor 16, and lift pins 46 are installed at least three positions of the bottom surface of the lower vessel 14 for lifting a wafer 8. In addition, a susceptor segment supporting unit 49 is installed in the vicinity of circular arcs of susceptor segments 4 (refer to FIG. 2) of the susceptor 16. The susceptor segment supporting unit 49 and the susceptor elevating mechanism 44 are used to move the susceptor 16 upward and downward. The susceptor segments 4 will be described later in detail.

The penetration holes 45 and the lift pins 46 are arranged in a manner such that the lift pins 46 can pass through the penetration holes 45 without making contact with the susceptor 16 when the susceptor 16 is moved downward by the susceptor elevating mechanism 44.

At the sidewall of the lower vessel 14, a gate valve 47 is installed. The gate valve 47 can be opened to carry a wafer 8 into or out of the process chamber 15 by using a carrying mechanism (carrying unit, not shown), and the gate valve 47 can be closed to make the process chamber 15 airtight.

A controller 48 is used as a control part (control unit) for controlling the APC 32, the on-off valve 33, the vacuum pump 34 via a signal line A; the susceptor elevating mechanism 44 via a signal line B; the gate valve 47 via a signal line C; the matching device 37 and the high-frequency power supply 38 via a signal line D; the mass flow controller 27 and the on-off valve 26 via a signal line E; and the heater buried in the susceptor 16 and the impedance varying device 41 via a signal line (not shown).

Next, an explanation will be given on a semiconductor device manufacturing process, specifically on a method of performing a predetermined plasma treatment on the surface of a wafer 8 or an under-layer film formed on the wafer 8 by using the above-described process furnace 42. In the following description, parts of the substrate processing apparatus are controlled by the controller 48.

By the carrying mechanism (not shown), a wafer 8 is carried from the outside of the process chamber 15 into the process chamber 15 and is placed on the susceptor 16. In detail, the wafer 8 is carried as follows.

When the susceptor 16 is moved down to a substrate receiving position, leading ends of the lift pins 46 pass through the penetration holes 45 of the susceptor 16. At this time, the lift pins 46 protrude from the surface of the susceptor 16 by a predetermined length.

Next, the gate valve 47 is opened, and the carrying mechanism (not shown) places the wafer 8 on the leading ends of the lift pins 46. Then, after the carrying mechanism is moved to the outside of the process chamber 15, the gate valve 47 is closed. Thereafter, the susceptor 16 is moved upward by the susceptor elevating mechanism 44 and the susceptor segment supporting unit 49 so that the wafer 8 can be placed on the top surface of the susceptor 16 and moved upward to a processing position.

The heater buried in the susceptor 16 is previously operated, and the wafer 8 is heated by the heater to a predetermined wafer processing temperature in the range from room temperature to 800° C. The inside of the process chamber 15 is kept at a pressure of 0.1 Pa to 100 Pa by using the vacuum pump 34 and the APC 32.

After the wafer 8 reaches the predetermined processing temperature and is stably maintained at the predetermined processing temperature, reaction gas 28 (such as $N_2$, $O_2$, $NH_3$, $NF_3$, and $PH_3$) is introduced toward the top surface (process surface) of the wafer 8 placed on the susceptor 16 through the gas inlet 19 and the gas blow outlet 24. At this time, the reaction gas 28 is supplied at a predetermined flow rate in the range from 100 sccm to 1000 sccm. At the same time, high-frequency power is applied to the tubular electrode 35 from the high-frequency power supply 38 through the matching device 37. The high-frequency power applied to the tubular electrode 35 has a predetermined level in the range from 150 W to 200 W. At this time, a desired impedance valve can be obtained by previously adjusting the impedance varying device 41.

Owing to a magnetic field formed by the tubular magnets 39, magnetron discharging occurs, and an electric charge is trapped above the wafer 8, so that high-density plasma can be generated in the plasma generating region 36. The surface of the wafer 8 placed on the susceptor 16 is treated by the high-density plasma. After the wafer 8 is treated, the wafer 8 is carried out from the process chamber 15 using the carrying mechanism (not shown) in the reverse order to the carrying-in order.

Next, with reference to FIG. 2A, FIG. 2B, FIG. 2C, and FIG. 3, an explanation will be given on a susceptor 2 relevant to a first embodiment of the present invention. The susceptor 2 corresponds to the susceptor 16 of the above-described MMT apparatus.

Figure 2A:
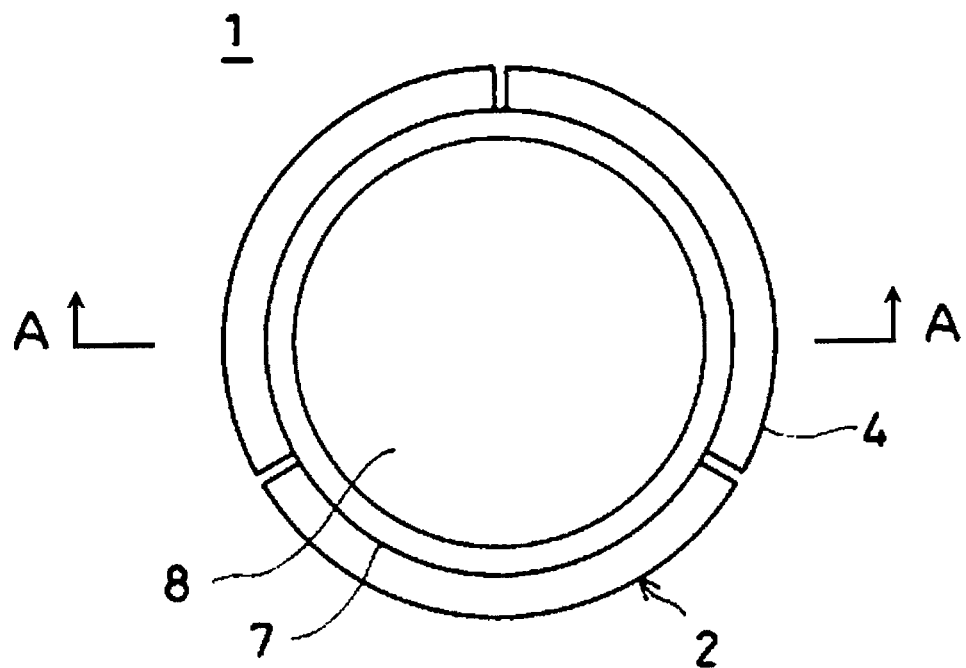
FIG. 2A through FIG. 2C are views illustrating main parts according to a first embodiment of the present invention.
Figure 2B:
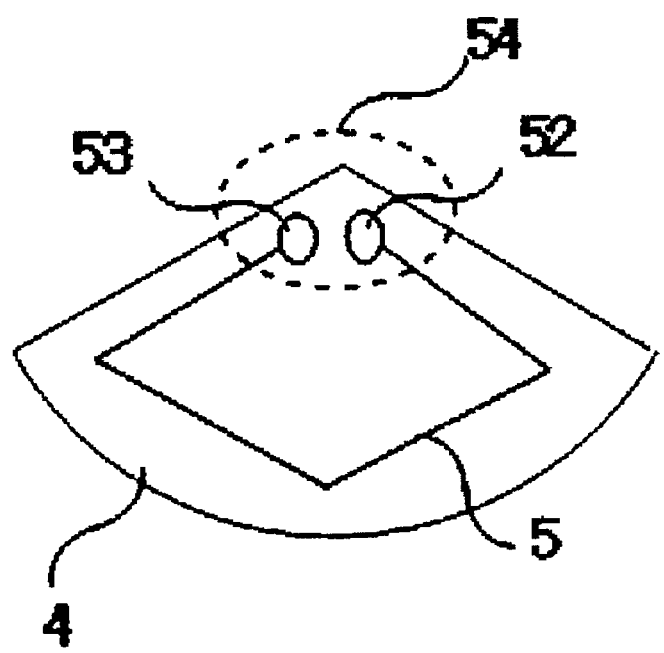
Figure 2C:
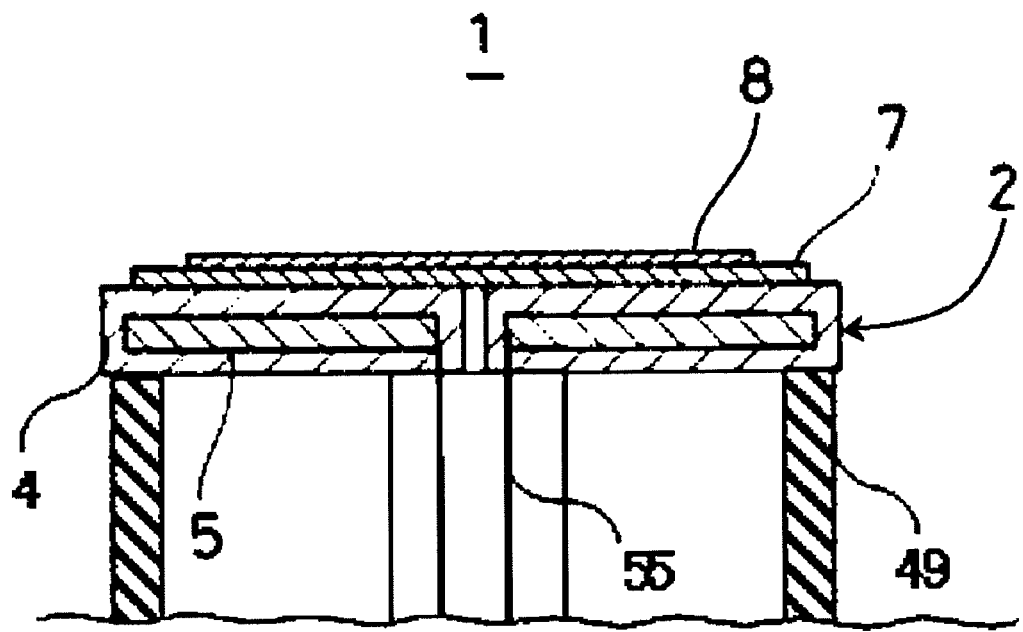
Figure 3:
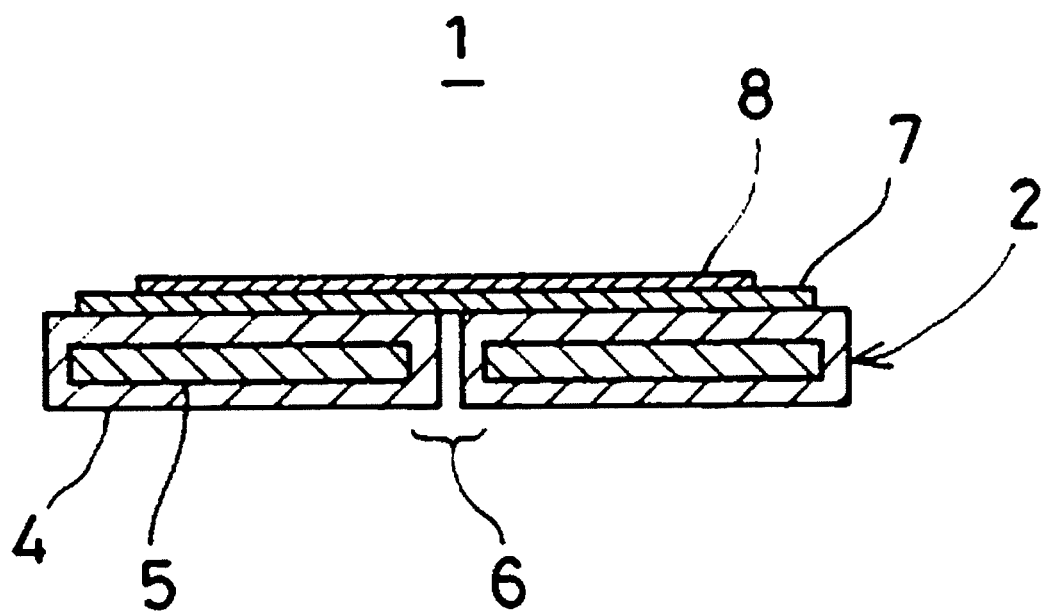
FIG. 3 is a sectional view taken along line A-A of FIG. 2A.

FIG. 2A is a plan view illustrating the susceptor 2 when a wafer 8 is placed on the top surface of the susceptor 2. FIG. 2C and FIG. 3 are sectional views taken along line A-A of FIG. 2A. FIG. 2B is view illustrating the relationship among susceptor segments 4, heater segments 5 (heating units), and power supply terminals 52 and 53. In the sectional view of FIG. 3 taken along line A-A of FIG. 2A, components such as a susceptor elevating mechanism 44 and a susceptor segment supporting unit 49 are omitted for brief description.

The present invention proposes a substrate stage 1 including a partitioned susceptor and a partitioned heater for processing a substrate having a large diameter.

The susceptor 2 of the substrate stage 1 is partitioned into three susceptor segments 4. Top surfaces of the susceptor segments 4 are sector-shaped. Apical parts 54 of the susceptor segments 4 are arranged at the center part of the susceptor 2 so that the top surface of the susceptor 2 can have a circular shape. The heater segments 5 (heating elements) are embedded in the susceptor segments 4, respectively.

In each susceptor segment 4, specifically, at the apical part 54 located at the apex of the sector-shaped susceptor segment 4, the power supply terminals 52 and 53 of the heater segment 5 (in detail, a power input terminal 52 and a power output terminal 53) are installed. Power supply lines 55 are connected to the power supply terminals 52 and 53 so that power can be supplied to the heater segment 5 from a power source (not shown). The power supply lines 55 are installed at the inside of the susceptor elevating mechanism 44. The inside of the susceptor elevating mechanism 44 is isolated from the atmosphere of the process chamber 15.

Since the power supply terminals 52 and 53 are installed at the apical part 54, the power supply lines 55 of each heater segment 5 can be put together, and thus the horizontal section of the susceptor elevating mechanism 44 can be small. Owing to the small size of the horizontal section of the susceptor elevating mechanism 44, the susceptor elevating mechanism 44 can be fabricated with low costs, and moreover, a low-power elevating mechanism such as a low-power motor can be used for the susceptor elevating mechanism 44.

The apical part 54 of the susceptor segment 4 is supported by the susceptor elevating mechanism 44, and the circular arc part of the susceptor segment 4 is supported by the susceptor segment supporting unit 49.

Preferably, the susceptor segment 4 is made of a plasma-resistant, heat-conductive material. For example, the susceptor segment 4 is made of a material such as silicon carbide (SiC), aluminum nitride (AlN), or quartz. Since the susceptor 2 has a partitioned structure and the heater segments 5 are embedded in the susceptor segments 4, as shown in FIG. 3, a discontinuous part 6 is formed in the heater used as a heating source. Particularly, the discontinuous part 6 is large at the center part of a substrate placement surface of the susceptor 2 where the apical parts 54 of the susceptor segments 4 are concentrated. Since the discontinuous part 6 is not heated, non-uniform temperature distribution is caused by the discontinuous part 6.

For this reason, a uniform heat plate 7 is mounted on the susceptor 2. The uniform heat plate 7 has a circular shape and a diameter larger than that of a wafer 8. If the uniform heat plate 7 is smaller than a wafer 8, heat is not directly transferred from the uniform heat plate 7 to a part of the wafer 8 protruded from the uniform heat plate 7, and thus nonuniform temperature distribution is caused. Since a wafer 8 is heated through the uniform heat plate 7, the temperature distribution of the wafer 8 can be uniform.

It is preferable that the entire surface of a wafer 8 be placed on the uniform heat plate 7, and the shape of the uniform heat plate 7 is not limited to a circular shape. For example, the uniform heat plate 7 may have a quadrangle shape.

During a process, the uniform heat plate 7 is directly exposed to plasma. Therefore, it is preferable that the uniform heat plate 7 be made of a plasma-resistant, heat-conductive material. For example, the uniform heat plate 7 may be made of a material such as silicon carbide (SiC), aluminum nitride (AlN), or quartz. By making the uniform heat plate 7 using a plasma-resistant material, generation of particles can be suppressed. In addition, by making the uniform heat plate 7 using a heat-conductive material, non-uniform heat distribution can be prevented. Here, generation of particles means the case where particles are generated from the uniform heat plate 7 when the uniform heat plate 7 is etched by plasma, and non-uniform heat distribution means the case where a substrate is non-uniformly heated through the uniform heat plate 7 when the uniform heat plate 7 is etched by plasma.

Figure 7:
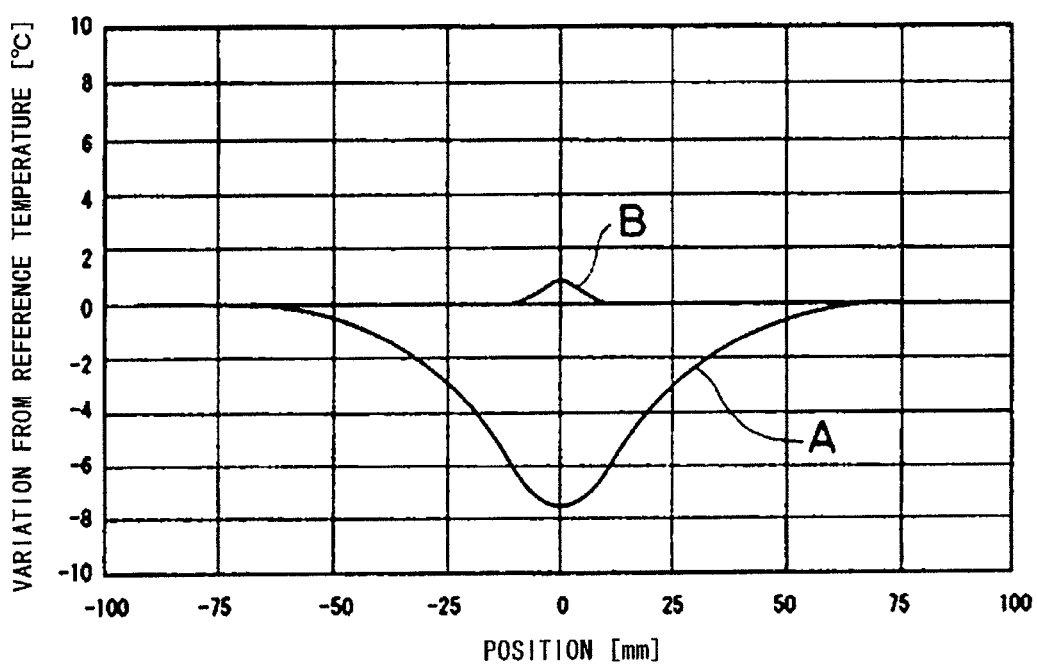
FIG. 7 is a graph illustrating temperature distribution of a substrate according to the present invention.

Temperature distribution of a substrate placed on the substrate stage 1 is illustrated by a curve A in FIG. 7. As shown by the curve A of FIG. 7, although the temperature distribution of the substrate is uniform at the peripheral part of the substrate owing to the uniform heat plate 7, the temperature of the substrate is locally decreased at the center par of the substrate due to the discontinuous part 6.

Next, with reference to FIG. 4 to FIG. 6, an explanation will be given on a susceptor 16 relevant to a second embodiment of the present invention.

Figure 4:
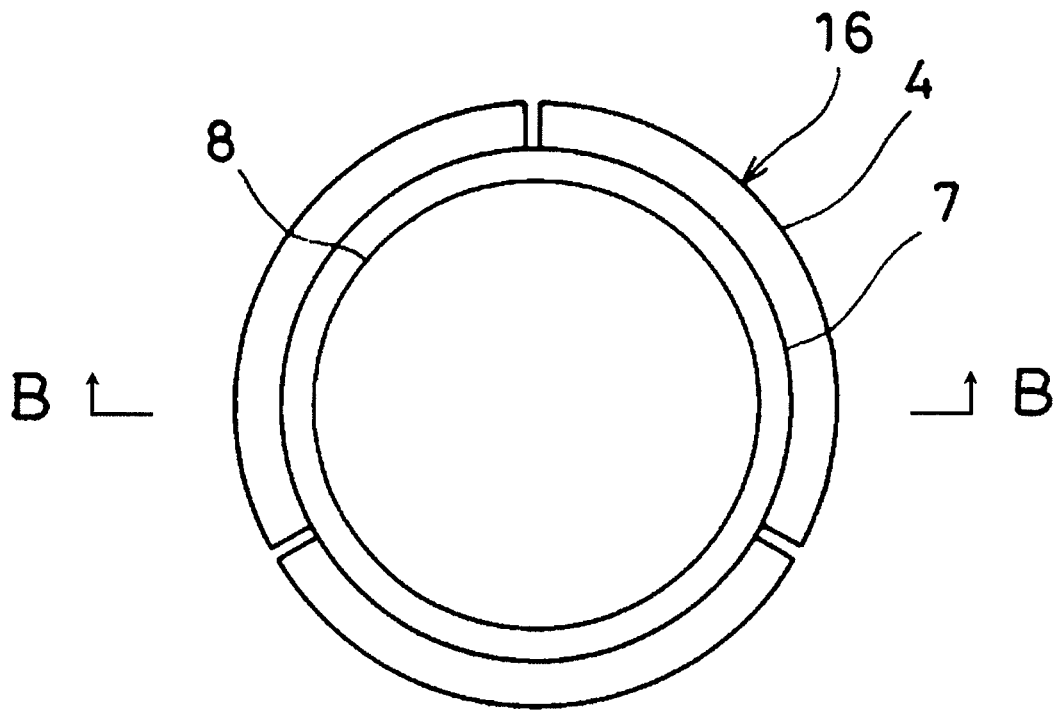
FIG. 4 is a schematic plan view illustrating main parts according to a second embodiment of the present invention.
Figure 5:
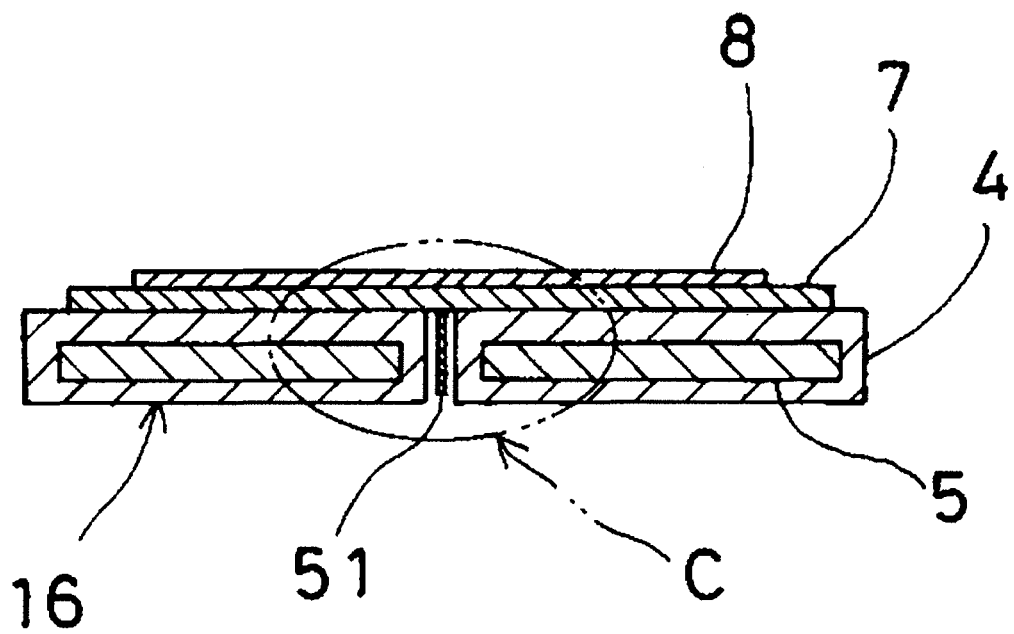
FIG. 5 is a sectional view taken along line B-B of FIG. 4.
Figure 6:
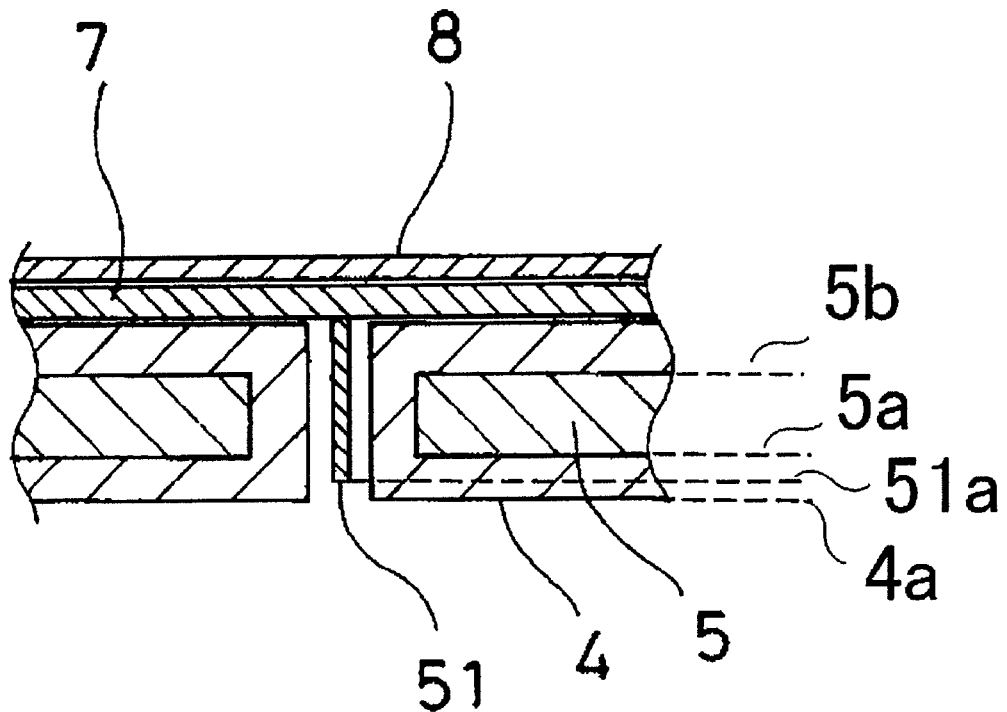
FIG. 6 is an enlarge view of section C of FIG. 5.

Elements of FIG. 4, FIG. 5, and FIG. 6 corresponding to those of FIG. 2A, FIG. 2B, FIG. 2C, and FIG. 3 are denoted by the same reference numerals. FIG. 4 is a plan view illustrating a susceptor 16 on which a wafer is placed. FIG. 5 is a sectional view taken along line B-B of FIG. 4. In FIG. 5, a susceptor elevating mechanism 44 and a susceptor segment supporting unit 49 are omitted for brevity of the description.

The susceptor 16 is partitioned into three susceptor segments 4. Top surfaces of the susceptor segments 4 are sector-shaped. Apical parts 54 of the susceptor segments 4 are arranged at the center part of the susceptor 2 so that the top surface of the susceptor 2 can have a circular shape. Heater segments 5 (heating elements) are embedded in the susceptor segments 4, respectively.

The heater segment 5 is embedded in each susceptor segment 4, and a part of the susceptor segment 4 covering the heater segment 5 is made of aluminum nitride (AlN) or quartz.

On the top surface of the susceptor 16, a uniform heat plate 7 made of silicon carbide (SiC) is installed, and a wafer 8 is placed on the uniform heat plate 7.

A heat transfer member used as a temperature stabilizing structure, such as a heat transfer plate 51 having a flat-plate section, is protruded from the bottom surface of the uniform heat plate 7. The heat transfer plate 51 is made of the same material as that used for making the uniform heat plate 7 or a material having thermal conductivity higher than that of a material used for making the uniform heat plate 7. In addition, the material used for making the heat transfer plate 51 is plasma-resistant for preventing generation of particles and non-uniform heat distribution caused by plasma introduced to the bottom side of the susceptor 16. If the uniform heat plate 7 and the heat transfer plate 51 are made of the same material, the heat transfer plate 51 and the uniform heat plate 7 may join to each other by, for example, welding to reduce heat resistance. The heat transfer plate 51 is inserted in gaps between the susceptor segments 4, and in the illustrated embodiment, the heat transfer plate 51 has a Y-shape branching at equal angles when viewed from the top.

Preferably, a vertical lower end 51a of the heat transfer plate 51 is located between vertical lower ends 4a of the susceptor segments 4 and vertical upper ends 5b of the heater segments 5. If the lower end 51a of the heat transfer plate 51 is located lower than the lower ends 4a of the susceptor segments 4, heat is dissipated through the lower end 51a of the heat transfer plate 51. On the other hand, if the lower end 51a of the heat transfer plate 51 is located higher than the upper ends 5b of the heater segments 5, heat may not be efficiently transferred from the heater segments 5 to the heat transfer plate 51, and thus a discontinuous part 6 may be formed.

When the uniform heat plate 7 is heated on the susceptor segments 4, since the uniform heat plate 7 is heated by heat transferred from the top surfaces of the susceptor segments 4, a part (non-heated part) of the uniform heat plate 7 located between the susceptor segments 4 is not efficiently heated.

Therefore, the heat transfer plate 51 is inserted in the gaps between the susceptor segments 4 to receive radiant heat from the susceptor segments 4. Since the heat transfer plate 51 is heated by radiant heat, heat dissipation through the non-heated part of the uniform heat plate 7 can be prevented, and heat can be transferred from the heat transfer plate 51 to the non-heated part of the uniform heat plate 7, so that the temperature of the non-heated part can be increased.

When the heat transfer plate 51 is installed at the uniform heat plate 7, the temperature of a wafer 8 can be distributed as indicated by the curve B in FIG. 7.

As shown by the curve B, the temperature of the wafer 8 is slightly higher at the center part than other part owing to the installation of the heat transfer plate 51. The temperature of the wafer 8 is very slightly higher at the center part. That is, the temperature distribution of the wafer 8 is much more uniform than the temperature distribution of a wafer 8 placed on the above-described susceptor 2.

The heat transfer plate 51 can have various shapes such as a Y-shape and a plate shape, and the thickness of the heat transfer plate 51 is not required to be uniform. That is, the thickness of the heat transfer plate 51 can be varied: for example, the heat transfer plate 51 can be thick at its center part and thin at its peripheral part according to desired temperature distribution. In addition, although the MMT apparatus is illustrated as an example of a substrate processing apparatus configured to perform a treatment using plasma, the present invention is not limited to the MMT apparatus. For example, the present invention can be applied to a parallel flat plate apparatus, an inductive coupled plasma (ICP) apparatus, or an electron cyclotron resonance (ECR) apparatus.

Furthermore, as well as the plasma processing apparatus, the present invention can be applied to a single wafer type apparatus such as a heating apparatus configured to perform a heat treatment. In the case of the plasma treatment apparatus, as described above, the uniform heat plate 7 and the heat transfer plate 51 may be made of a plasma resistant material such as silicon carbide (SiC). However, in the case of a heating apparatus, the uniform heat plate 7 and the heat transfer plate 51 can be made of other materials such as carbon. That is, when plasma resistance is not considered, inexpensive materials can be used.

According to the present invention, owing to the heat transfer member (heat transfer plate 51) disposed between the susceptor segments, a large-diameter substrate can be processed, and the substrate can be uniformly heated with no temperature drop at the boundary between the susceptor segments.

(Supplementary Note)

The present invention also includes the following embodiments.

(Supplementary Note 1)

According to a preferred embodiment of the present invention, there is provided a substrate stage comprising: a plurality of susceptor segments embedded with heating units; a substrate stage unit comprising the susceptor segments arranged in a flat configuration to define a substrate placement surface; and a uniform heating part mounted at the substrate placement surface.

(Supplementary Note 2)

In the substrate stage of Supplementary Note 1, the arranged susceptor segments have sector-shaped top surfaces, and power input terminals of the heating units are installed at apical parts of the susceptor segments.

(Supplementary Note 3)

In the substrate stage of Supplementary Note 1, the uniform heating part has a diameter greater than that of a substrate placed on the uniform heating part.

(Supplementary Note 4)

In the substrate stage of Supplementary Note 3, the uniform heating part and the heat transfer part are made of the same material.

(Supplementary Note 5)

In the substrate stage of Supplementary Note 4, the arranged susceptor segments have sector-shaped top surfaces, and power input terminals of the heating units are installed at apical parts of the susceptor segments.

(Supplementary Note 6)

In the substrate stage of Supplementary Note 3, the arranged susceptor segments have sector-shaped top surfaces, and power input terminals of the heating units are installed at apical parts of the susceptor segments.

(Supplementary Note 7)

The substrate stage of Supplementary Note 1 further comprises a heat transfer part between the susceptor segments.

(Supplementary Note 8)
In the substrate stage of Supplementary Note 7, a lower end of the heat transfer part is located between the heating units ad lower ends of the susceptor segments in a vertical direction.

(Supplementary Note 9)
In the substrate stage of Supplementary Note 8, the uniform heating part has a diameter greater than that of a substrate placed on the uniform heating part.

(Supplementary Note 10)
In the substrate stage of Supplementary Note 9, the arranged susceptor segments have sector-shaped top surfaces, and power input terminals of the heating units are installed at apical pails of the susceptor segments.

(Supplementary Note 11)
In the substrate stage of Supplementary Note 8, the uniform heating part and the heat transfer part are made of the same material.

(Supplementary Note 12)
In the substrate stage of Supplementary Note 11, the arranged susceptor segments have sector-shaped top surfaces, and power input terminals of the heating units are installed at apical parts of the susceptor segments.

(Supplementary Note 13)
In the substrate stage of Supplementary Note 8, the arranged susceptor segments have sector-shaped top surfaces, and power input terminals of the heating units are installed at apical parts of the susceptor segments.

(Supplementary Note 14)
In the substrate stage of Supplementary Note 7, the uniform heating part has a diameter greater than that of a substrate placed on the uniform heating part.

(Supplementary Note 15)
In the substrate stage of Supplementary Note 14, the uniform heating part and the heat transfer part are made of the same material.

(Supplementary Note 16)
In the substrate stage of Supplementary Note 15, the arranged susceptor segments have sector-shaped top surfaces, and power input terminals of the heating units are installed at apical parts of the susceptor segments.

(Supplementary Note 17)
In the substrate stage of Supplementary Note 14, the arranged susceptor segments have sector-shaped top surfaces, and power input terminals of the heating units are installed at apical parts of the susceptor segments.

(Supplementary Note 18)
In the substrate stage of Supplementary Note 7, the uniform heating part and the heat transfer part are made of the same material.

(Supplementary Note 19)
In the substrate stage of Supplementary Note 18, the arranged susceptor segments have sector-shaped top surfaces, and power input terminals of the heating units are installed at apical parts of the susceptor segments.

(Supplementary Note 20)
In the substrate stage of Supplementary Note 7, the arranged susceptor segments have sector-shaped top surfaces, and power input terminals of the heating units are installed at apical parts of the susceptor segments.

(Supplementary Note 21)
According to another preferred embodiment of the present invention, there is provided a substrate processing apparatus comprising: a gas supply unit configured to supply process gas; a plasma generating unit configured to generate plasma; a process chamber configured to accommodate a substrate for processing the substrate using the plasma; an exhaust unit configured to exhaust an atmosphere of the process chamber; and a substrate stage installed at the process chamber for placing the substrate thereon, wherein the substrate stage comprises: a plurality of susceptor segments embedded with heating units; a substrate stage unit comprising the susceptor segments arranged in a flat configuration to define a substrate placement surface; and a uniform heating part mounted at the substrate placement surface.

(Supplementary Note 22)
The substrate stage of Supplementary Note 21, further comprises a heat transfer part between the susceptor segments.

(Supplementary Note 23)
In the substrate stage of Supplementary Note 22, the uniform heating part or the heat transfer part is made of silicon carbide (SiC).

(Supplementary Note 24)
According to another preferred embodiment of the present invention, there is provided a substrate processing apparatus comprising: a gas supply unit configured to supply process gas; a process chamber configured to process a substrate by heating the substrate; an exhaust unit configured to exhaust an atmosphere of the process chamber; and a substrate stage installed at the process chamber for placing the substrate thereon, wherein the substrate stage comprises: a plurality of susceptor segments embedded with heating units; a substrate stage unit comprising the susceptor segments arranged in a flat configuration to define a substrate placement surface; and a uniform heating part mounted at the substrate placement surface.

What is claimed is:

1. A substrate stage comprising:
a plurality of annular sector-shaped susceptor segments, each of the plurality of annular sector-shaped susceptor segments being embedded with a heating unit; and
a substrate stage unit partitioned into the plurality of annular sector-shaped susceptor segments,
wherein the plurality of annular sector-shaped susceptor segments are arranged in a manner that upper surfaces of the plurality of annular sector-shaped susceptor segments define a substrate placement surface with gaps between the plurality of annular sector-shaped susceptor segments;
a uniform heating part mounted between the substrate placement surface and a substrate along each of the plurality of annular sector-shaped susceptor segments; and
a heat transfer part inserted in the gaps between the plurality of annular sector-shaped susceptor segments under the uniform heating part wherein the heat transfer part is configured to receive radiant heat from the heating unit and transfer heat to the uniform heating part.

2. The substrate stage of claim 1, wherein a power input terminal of the heating unit is installed at an apical part of each of the plurality of annular sector-shaped susceptor segments.

3. The substrate stage of claim 1, wherein a diameter of the uniform heating part is greater than that of a substrate placed on the uniform heating part.

4. The substrate stage of claim 3, wherein a power input terminal of the heating unit is installed at an apical part of each of the plurality of annular sector-shaped susceptor segments.

5. The substrate stage of claim 1, wherein a lower end of the heat transfer part is located between the heating unit and lower ends of the plurality of annular sector-shaped susceptor segments in a vertical direction.

6. The substrate stage of claim 5, wherein a diameter of the uniform heating part is greater than that of a substrate placed on the uniform heating part.

7. The substrate stage of claim 6, wherein a power input terminal of the heating unit is installed at an apical part of each of the plurality of annular sector-shaped susceptor segments.

8. The substrate stage of claim 5, wherein a power input terminal of the heating unit is installed at an apical part of each of the plurality of annular sector-shaped susceptor segments.

9. The substrate stage of claim 1, wherein a diameter of the uniform heating part is greater than that of a substrate placed on the uniform heating part.

10. The substrate stage of claim 9, wherein a power input terminal of the heating unit is installed at an apical part of each of the plurality of annular sector-shaped susceptor segments.

11. The substrate stage of claim 1, wherein the uniform heating part and the heat transfer part are made of a same material.

12. The substrate stage of claim 11, wherein a power input terminal of the heating unit is installed at an apical part of each of the plurality of annular sector-shaped susceptor segments.

13. The substrate stage of claim 1, wherein the heat transfer part has a flat-plate shape.

14. The substrate stage of claim 1, further comprising a gap between the heat transfer part and sidewalls of the plurality of annular sector-shaped susceptor segments.

15. A substrate processing apparatus comprising:
a gas supply unit configured to supply process gas;
a plasma generating unit configured to generate plasma;
a process chamber configured to accommodate a substrate for processing the substrate using the plasma;
an exhaust unit configured to exhaust an atmosphere of the process chamber; and
a substrate stage installed at the process chamber for placing the substrate thereon,
wherein the substrate stage comprises:
a plurality of circular sector-shaped susceptor segments, each of the plurality of circular sector-shaped susceptor segments being embedded with a heating unit;
a substrate stage unit partitioned into the plurality of circular sector-shaped susceptor segments,
wherein the plurality of circular sector-shaped susceptor segments are arranged in a manner that upper surfaces of the plurality of circular sector-shaped susceptor segments define a substrate placement surface with gaps between the plurality of circular sector-shaped susceptor segments;
a uniform heating part mounted between the substrate placement surface and a substrate along each of the plurality of sector-shaped susceptor segments; and
a heat transfer part inserted in the gaps between the plurality of circular sector-shaped susceptor segments under the uniform heating part wherein the heat transfer part is configured to receive radiant heat from the heating unit and transfer heat to the uniform heating part.

16. The substrate stage of claim 1, wherein the uniform heating part or the heat transfer part is made of silicon carbide (SiC).

17. A substrate processing apparatus comprising:
a gas supply unit configured to supply process gas;
a process chamber configured to process a substrate by heating the substrate;
an exhaust unit configured to exhaust an atmosphere of the process chamber; and
a substrate stage installed at the process chamber for placing the substrate thereon,
wherein the substrate stage comprises:
a plurality of sector-shaped susceptor segments, each of the plurality of sector-shaped susceptor segments being embedded with a heating unit;
a substrate stage unit partitioned into the plurality of sector-shaped susceptor segments,
wherein the plurality of sector-shaped susceptor segments are arranged in a manner that upper surfaces of the plurality of sector-shaped susceptor segments define a substrate placement surface with gaps between the plurality of sector-shaped susceptor segments;
a uniform heating part mounted between the substrate placement surface and a substrate along each of the plurality of sector-shaped susceptor segments; and
a heat transfer part inserted in the gaps between the plurality of sector-shaped susceptor segments under the uniform heating part wherein the heat transfer part is configured to receive radiant heat from the heating unit and transfer heat to the uniform heating part.

* * * * *